United States Patent

Shoji et al.

Patent Number: 5,928,965
Date of Patent: Jul. 27, 1999

[54] METHOD FOR DRY-ETCHING OF SILICON SUBSTRATE

[75] Inventors: Hideyuki Shoji; Takakazu Kusuki, both of Tokyo, Japan

[73] Assignee: NEC Corporation, Tokyo, Japan

[21] Appl. No.: 08/909,263

[22] Filed: Aug. 11, 1997

[30] Foreign Application Priority Data

Aug. 26, 1996 [JP] Japan ................................ 8-223573

[51] Int. Cl.⁶ .................................................. H01L 21/00
[52] U.S. Cl. .............................. 438/719; 216/37; 216/67; 438/695; 438/735; 438/738; 438/700
[58] Field of Search ..................... 216/2, 37, 39, 216/41, 51, 67, 79; 438/695, 696, 700, 701, 713, 719, 735, 738

[56] References Cited

U.S. PATENT DOCUMENTS

| | | | |
|---|---|---|---|
| 4,450,042 | 5/1984 | Purdes | 438/719 X |
| 4,490,209 | 12/1984 | Hartman | 438/719 X |
| 4,726,879 | 2/1988 | Bondur et al. | 438/713 X |

FOREIGN PATENT DOCUMENTS

| | | |
|---|---|---|
| 56-105574 | 7/1981 | Japan . |
| 61-269551 | 11/1986 | Japan . |
| 62-264981 | 10/1987 | Japan . |
| 63-237321 | 9/1988 | Japan . |

*Primary Examiner*—William Powell
*Attorney, Agent, or Firm*—Laff,Whitesel & Saret, Ltd.

[57] ABSTRACT

A method for dry-etching a silicon substrate by the use of a mask selectively formed on the silicon substrate, in which method a reaction product of dry etching is deposited, during dry etching, in a uniform thickness on the side wall of each groove formed in the silicon substrate by dry etching. In the inventive method, etching is conducted by using, as an etching gas, a mixed gas containing $Cl_2$, HBr, $O_2$ and He or a mixed gas contained $Cl_2$, HBr and CO, under the conditions of an etching pressure of 0.02–0.05 Torr, a RF power density of 1.01–1.64 W/cm² and a substrate temperature of 40–50° C. With this method, the tapered sectional shape of each groove formed in the silicon substrate can be controlled easily and etching can be conducted at high reproducibility.

7 Claims, 8 Drawing Sheets

(a)

(b)

(c)

F i G. 2
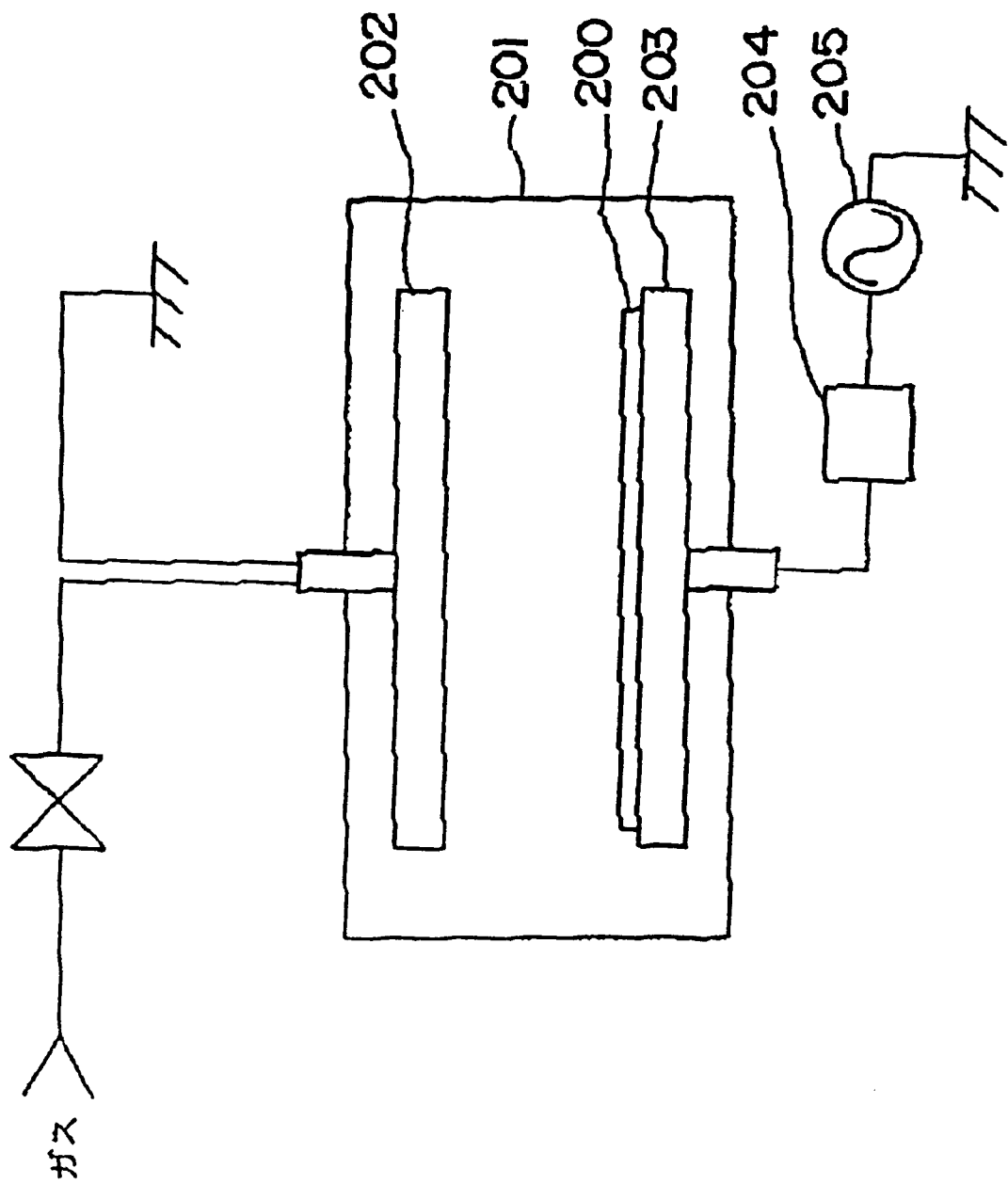
ガス

F i G. 4
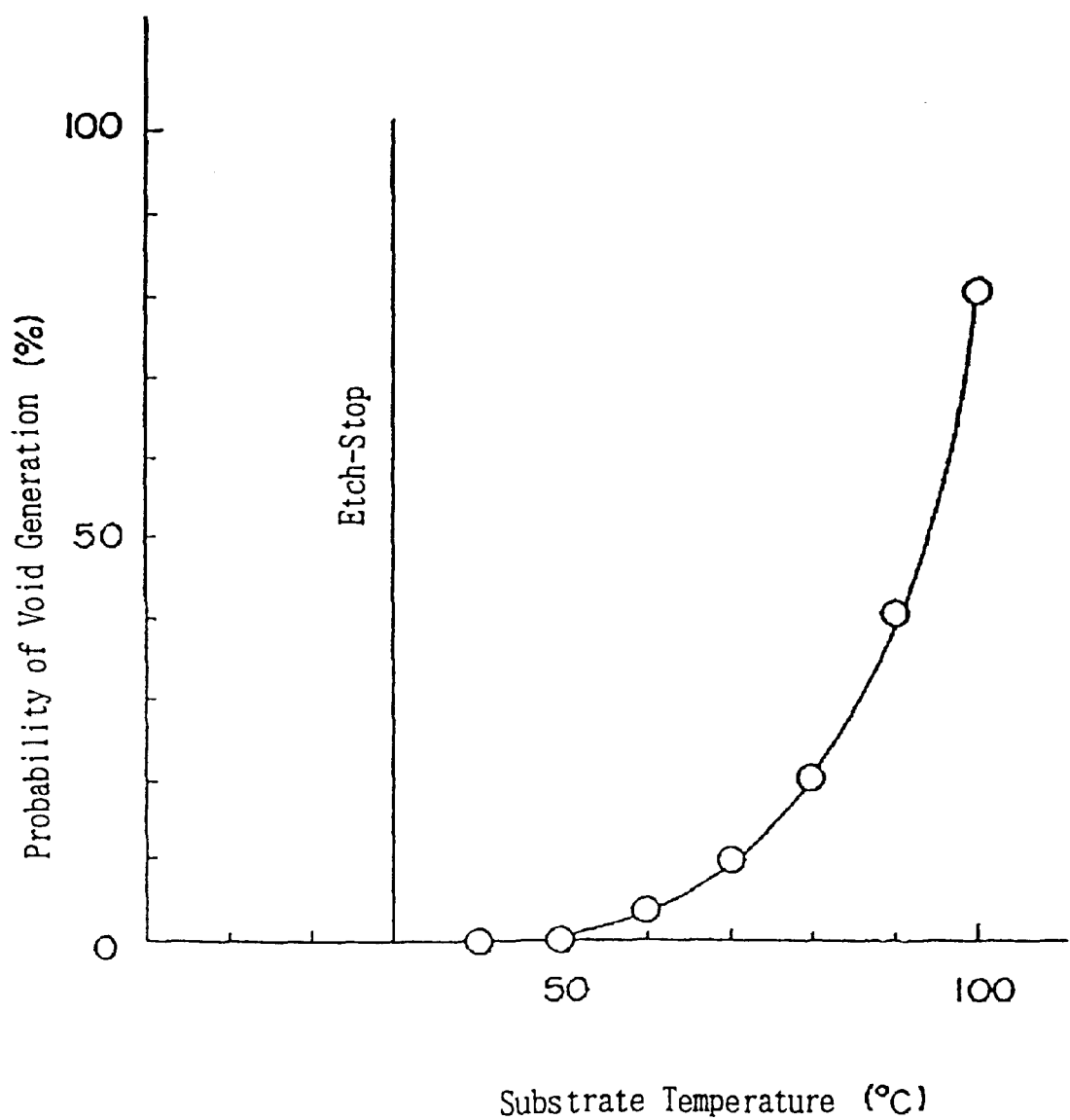

(a)

(b)

(c)

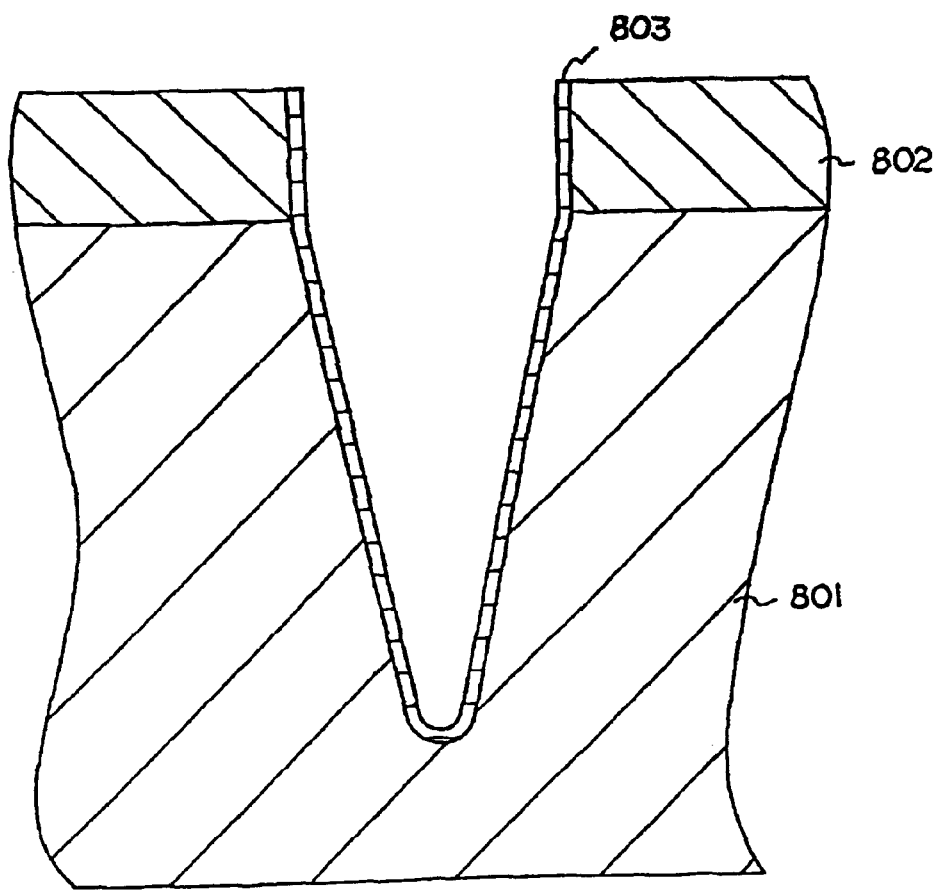
F i G. 8

METHOD FOR DRY-ETCHING OF SILICON SUBSTRATE

BACKGROUND OF THE INVENTION

1. Field of the Invention

The present invention relates to a method for dry-etching of silicon substrate, used in production of semiconductor device.

2. Description of the Prior Art

In recent years, LSI devices have been required to have fineness in order to achieve a high degree of integration. In this connection, fineness is required as well in formation of isolation regions. Hence, it has been considered to form isolation by making narrow and deep grooves in a substrate and then filling up the grooves with an insulating material. In this approach, voids must not be formed in the grooves at the time of filling up the grooves with an insulating material, in order to produce a reliable device.

A method for preventing formation of voids when an insulating material is filled up in the grooves, is described in Japanese Patent Application Laid-Open (Kokai) No. 1-107554. The method is explained with reference to FIG. 7. First, as shown in FIG. 7(a), a silicon oxide film 702 is formed on a silicon substrate 701 by patterning, only at the substrate areas where grooves are to be formed. Then, as shown in FIG. 7(b), isotropic plasma etching is conducted to the silicon substrate 701 using the silicon oxide film 702 as a mask, whereby dents having an arc-shaped section are formed. As shown in FIG. 7(c), anisotropic etching is conducted to each dent using the silicon oxide film 702 as a mask, to form a groove 703 of desired depth. Next, as shown in FIG. 7(d), the silicon oxide film 702 (mask) is removed, whereby the groove 703 comes to have a sectional shape having a taper 704 at the opening. Into the groove 703 is filled up a silicon oxide film 705 and then a flattening technique by etch back is applied, whereby is completed, as shown in FIG. 7(e), isolation by a groove 703 filled up with a silicon oxide film 705. Thus, formation of taper 704 at groove opening makes smooth the filling of silicon oxide film 705 and can prevent appearance of voids.

A method for preventing formation of voids at the time of filling an insulating material into a groove, is also described in Japanese Patent Application Laid-Open (Kokai) No. 58-9333. In the method is formed a groove of tapered sectional shape having an inclination of about 30–65° at the top and an inclination of about 70–90° at the bottom.

In each of these two methods for groove formation, isotropic etching is conducted in the first etching for silicon substrate [Japanese Patent Application Laid-Open (Kokai) No. 1-107554] and in the etching for obtaining inclination at groove top [Japanese Patent Application Laid-Open (Kokai) No. 58-9333]. Therefore, the amount of etching in horizontal direction must be taken into consideration at the stage of device designing, which makes it difficult to obtain a device of high integration and fineness.

In Japanese Patent Application Laid-Open (Kokai) No. 63-124420 is described a method of forming each groove without resorting to isotropic etching and then filling an insulating film in the groove without forming voids in the groove. In this method, there is used, as an etching gas, a gas capable of forming a deposit upon plasma polymerization, or a gas capable of forming a deposit by reacting with an etching product; the gas pressure is set at less than 0.01 Torr; the sample temperature is kept lower than 70° C.; thereby, the groove formed is allowed to have a tapered sectional shape so that an insulating film can be filled in the groove in an improved state.

Other method for forming each groove of tapered sectional shape is described in Japanese Patent Application Laid-Open (Kokai) No. 2-84721. In this method, etching is conducted using, as an etching gas, a mixed gas containing boron chloride and nitrogen.

Each of the above two methods has a problem. In the method described in Japanese Patent Application Laid-Open (Kokai) No. 63-124420, intended etching is possible when a silicon oxide film is used as a mask material, but is difficult when a photoresist is used. This is because the reaction product formed during etching differs depending upon the mask material used and has a largely different protective action for the side wall of groove. $SiO_x$ (when the mask is silicon oxide film) or $SiC_x$ (when the mask is a photoresist) is contained in the reaction product and deposits on the side wall of groove. $SiC_x$, as compared with $SiO_x$, has a small protective action for the side wall of groove; accordingly, it is difficult to form a vertical groove of tapered sectional shape by using a photoresist. In the method described in Japanese Patent Application Laid-Open (Kokai) No. 2-84721, the side wall-protecting film formed comprises boron and nitrogen, is very hard and strong, and is very hard to remove after etching.

SUMMARY OF THE INVENTION

An object of the present invention is to provide a method for dry-etching of a silicon substrate used in semiconductor production, particularly an isolation step, which method can control the tapered sectional shape of each groove formed during dry etching, without resorting to the mask material used.

A further object of the present invention is to provide a dry-etching method which, as compared with conventional techniques, can easily control the tapered sectional shape of each groove formed during dry etching and can conduct etching at high reproducibility.

The above objects of the present invention can be achieved by providing a method for dry-etching a silicon substrate by the use of a mask selectively formed on the silicon substrate, in which method a reaction product of dry etching is deposited, during dry etching, in a uniform thickness on the sidewall of each groove formed in the silicon substrate by dry etching.

By depositing a reaction product in a uniform thickness, the tapered sectional shape of each groove can be controlled easily and etching of high reproducibility is made possible.

In controlling the tapered sectional shape of the groove formed in etching of silicon substrate, two control parameters are important, that is, (1) control of the thickness of reaction product deposited on the side wall of groove formed by etching and (2) control of ion energy applied.

A tapered sectional shape of groove, having no bowing can be obtained by selectively forming a mask material 802 on a silicon substrate 801, depositing a reaction product 803 in a uniform thickness on the side wall of each groove formed by etching, as shown in FIG. 8, and allowing the ion contributing to etching to have such an energy that causes no reflection on the side wall.

Specifically, an intended tapered sectional shape of groove can be obtained by using a gas mixture showing optimum deposition of reaction product, appropriately setting the temperature of substrate, and setting the etching pressure and the RF power density so that the reaction product deposited on the side wall of groove is not completley removed and there occurs no reflection of ion.

In the present invention, by using, as an etching gas, a mixed gas containing $Cl_2$, HBr, $O_2$ and He or a mixed gas containing $Cl_2$, HBr and CO, etching is conducted under the conditions of a dry-etching gas pressure of 0.02–0.05 Torr, a RF power density of 1.01–1.64 W/cm$^2$ and a silicon substrate temperature of 40–50° C. Thereby, etching of excellent control of tapered groove shape and excellent reproducibility is made possible. Also, control of tapered groove shape not resorting to mask material becomes possible.

BRIEF DESCRIPTION OF THE DRAWINGS

FIG. 2 is a sectional view of a dry-etching apparatus.

FIG. 4 is a graph showing the degree of void generation when etching is conducted with the substrate temperature varied and then an insulating film is filled in the groove formed, according to the present invention.

FIG. 8 is a drawing showing a state in which a reaction product is deposited, in an ideal state, on the side wall of the groove formed by etching.

DESCRIPTION OF THE PREFERRED EMBODIMENT

Figure 1:
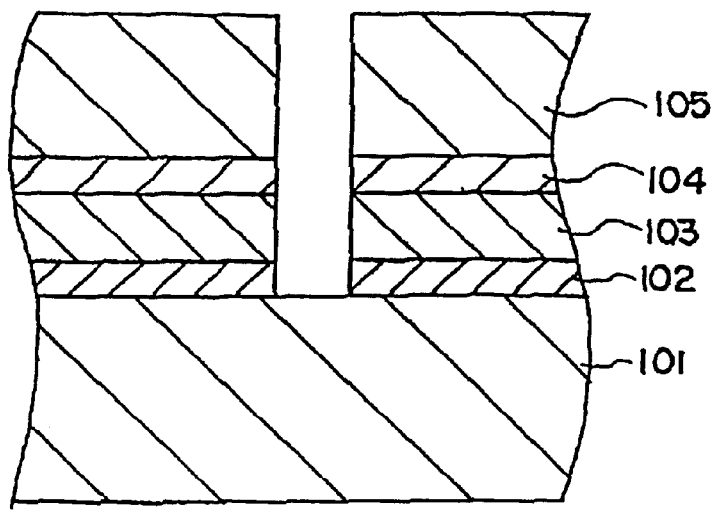
FIG. 1(*a–c*) is drawings showing a dry-etching method according to the first embodiment of the present invention.
Figure 1:
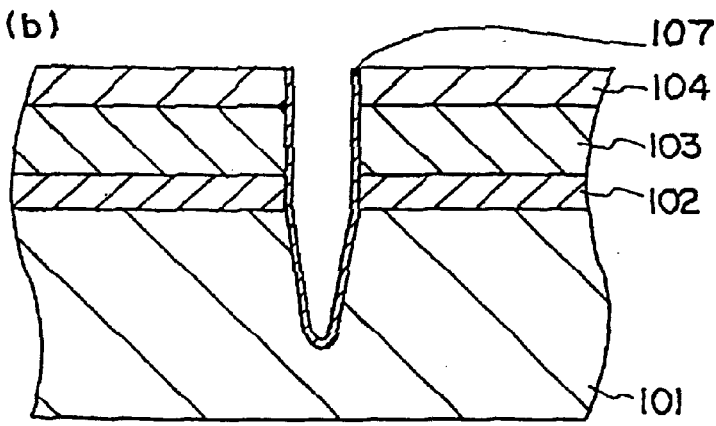
Figure 1:
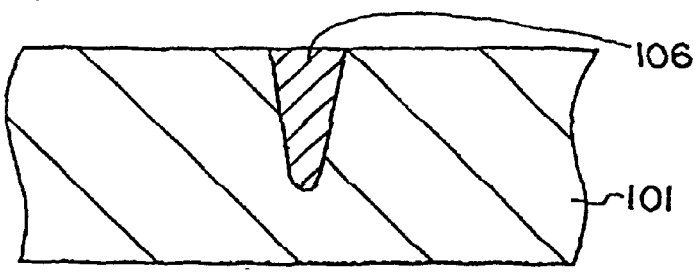

FIG. 1 is schematic sectional views showing a dry-etching method according to the first embodiment of the present invention.

First, as shown in FIG. 1(*a*), on a silicon substrate 101 are formed a silicon oxide film 102, a silicon nitride film 103 and a silicon oxide film 104 in this order; a photoresist 105 is applied and lithography is conducted to form a pattern; and the silicon oxide film 104, the silicon nitride film 103 and the silicon oxide film 102 are subjected to known dry etching.

The photoresist 105 is removed by $O_2$ plasma or the like; then, as shown in FIG. 1(*b*), the resulting semiconductor substrate is subjected to etching using the silicon oxide film 104 as a mask, by the use of a dry-etching apparatus shown in FIG. 2, whereby the silicon substrate 101 is subjected to etching while a reaction product 107 is being deposited on the side wall of a groove formed by etching.

This dry-etching apparatus comprises a chamber 201 having a gas-feeding mechanism at the top, an upper electrode 202 provided inside the chamber, a lower electrode 203 capable of mounting thereon a semiconductor substrate 200, also provided inside the chamber (the two electrodes face each other), and a RF electric source 205 (RF=13.56 MHz) connected to the lower electrode via a matching box 204.

In the present embodiment, when etching is conducted under the conditions of $Cl_2$=20–30 sccm, HBr=15–20 sccm, $O_2$=2–4 sccm, He=20–50 sccm, etching pressure=0.02–0.05 Torr, RF power density=1.01–1.64 W/cm$^2$ and stage temperature=10–20° C., grooves of good tapered sectional shape can be obtained. In this case, the substrate temperature is preferably 40–50° C.

Lastly, as shown in FIG. 1(*c*), the reaction product 107 deposited on the side wall of groove is removed using hydrofluoric acid; an insulating film (e.g. silicon oxide film) 106 is filled up in the groove; the insulating film 106 and the silicon oxide film 104 are polished by a CMP technique; the silicon nitride film 103 and the silicon oxide film 102 are removed by wet etching; thereby, isolation is completed.

Figure 3:
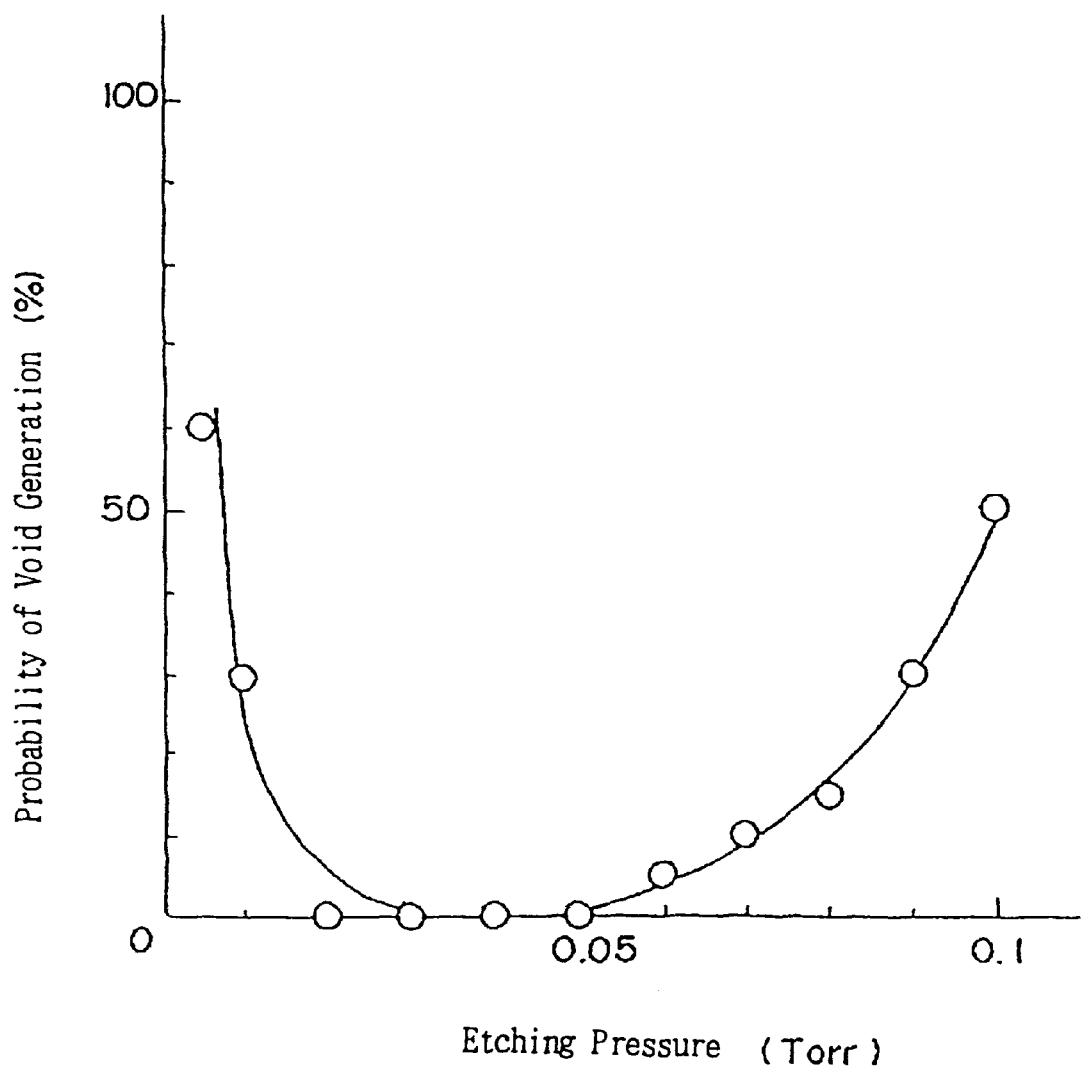
FIG. 3 is a graph showing the degree of void generation when etching is conducted with the etching pressure varied and then an insulating film is filled in the groove formed, according to the present invention.

FIG. 3 shows a probability of void generation in groove when etching was conducted at various etching pressures and an insulating film was filled in the resulting groove.

As is appreciated from the results of FIG. 3, the probability (%) of void generation is 0 (zero) when the etching pressure is in a range of 0.02–0.05 Torr, but voids are generated at any etching pressure higher or lower than the range. Therefore, the etching pressure is desirably 0.02–0.05 Torr.

FIG. 4 shows a probability of void generation in groove when etching was conducted at various substrate temperatures and an insulating film was filled in the resulting groove. As is appreciated from the result of FIG. 4, the probability (%) of void generation is 0 (zero) when the substrate temperature is in a range of 40–50° C.; however, voids are generated at temperatures higher than the range and, at temperatures lower than the range, the amount of deposition of reaction product is large and etching stops. Therefore, the substrate temperature is desirably 40–50° C.

Figure 5:
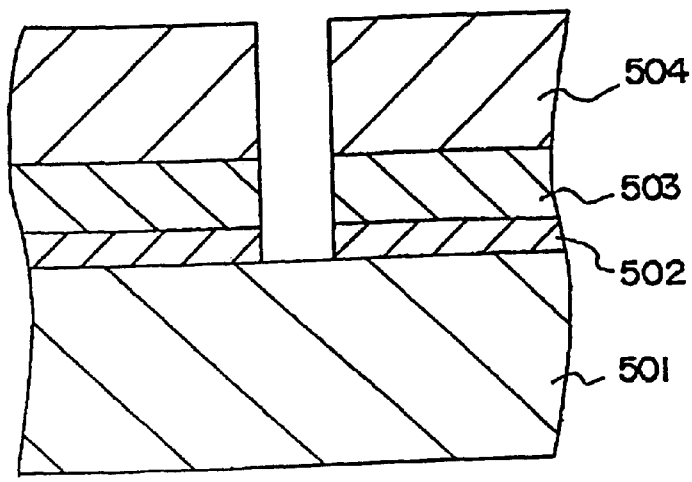
FIG. 5(*a–c*) is drawings showing a dry-etching method according to the second embodiment of the present invention.
Figure 5:
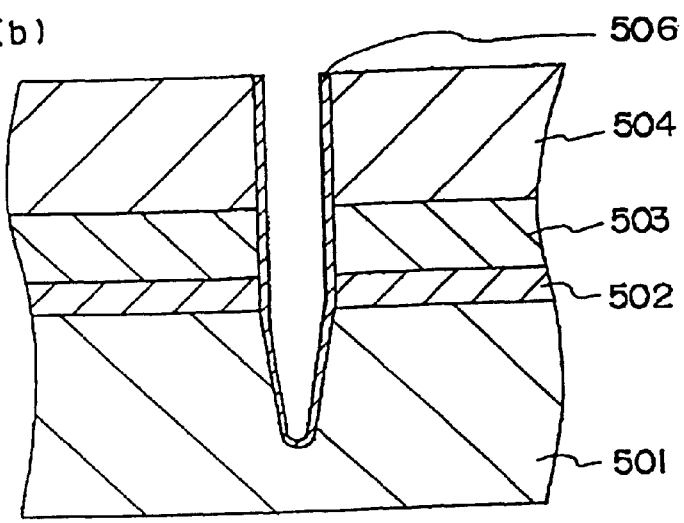
Figure 5:
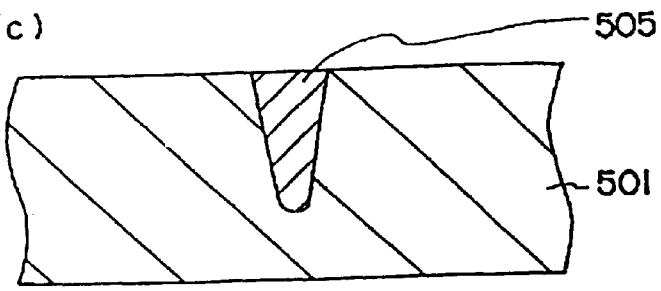

FIG. 5 is schematic sectional views showing a dry-etching method according to the second embodiment of the present invention.

First, as shown in FIG. 5(*a*), on a silicon substrate 501 are formed a silicon oxide film 502 and a silicon nitride film 503 in this order; a photoresist 504 is applied and lithography is conducted to form a pattern; and the silicon nitride film 503 and the silicon oxide film 502 are subjected to known dry etching.

Then, as shown in FIG. 5(*b*), the resulting semiconductor substrate is subjected to etching by the use of a dry-etching apparatus shown in FIG. 2, whereby the silicon substrate 501 is subjected to etching while a reaction product 506 is being deposited on the side wall of a groove formed by etching.

In the present embodiment, the etching conditions are the same as used in the first embodiment.

In the present embodiment, a photoresist (not a silicon oxide film) is used as a mask material. Nevertheless, since an oxygen-containing etching gas is used, a $SiO_2$-containing reaction product 506 is deposited on the side wall of groove and acts in the same manner as a silicon oxide film mask.

Lastly, as shown in FIG. 5(*c*), the reaction product 506 deposited on the side wall of groove is removed using hydrofluoric acid; the photoresist 504 is removed using $H_2SO_4/H_2O_2$; an insulating film (e.g. silicon oxide film) 505 is filled up in the groove; the insulating film 505 is polished by a CMP technique; the silicon nitride film 503 and the silicon oxide film 502 are removed by wet etching; thereby, isolation is completed.

In the present embodiment, unlike in the first embodiment, a photoresist (not a silicon oxide film) is used as a mask for etching. Therefore, the etching operation is simple as compared with that of the first embodiment.

Figure 6:
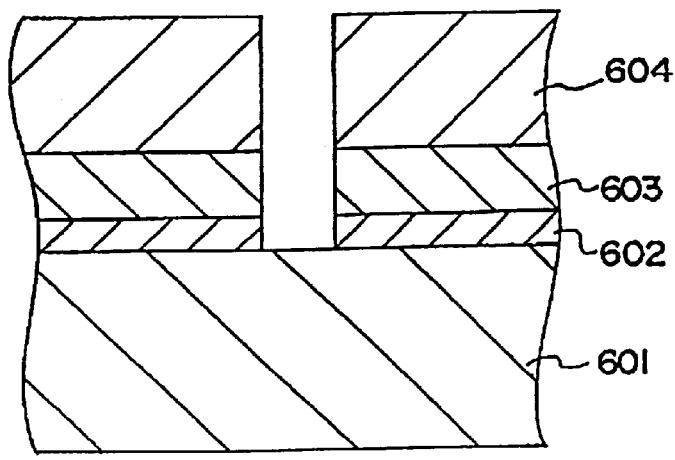
FIG. 6(*a–c*) is drawings showing a dry-etching method according to the third embodiment of the present invention.
Figure 6:
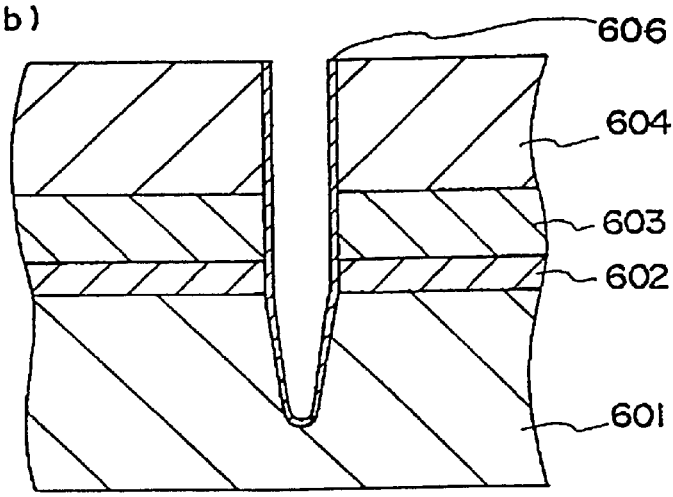
Figure 6:
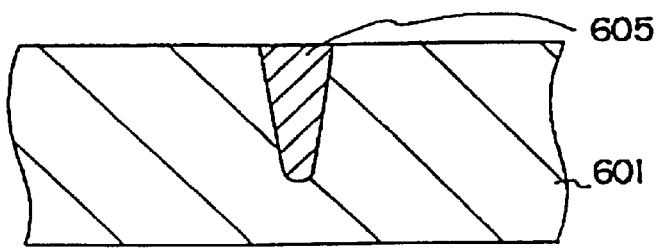
Figure 7:
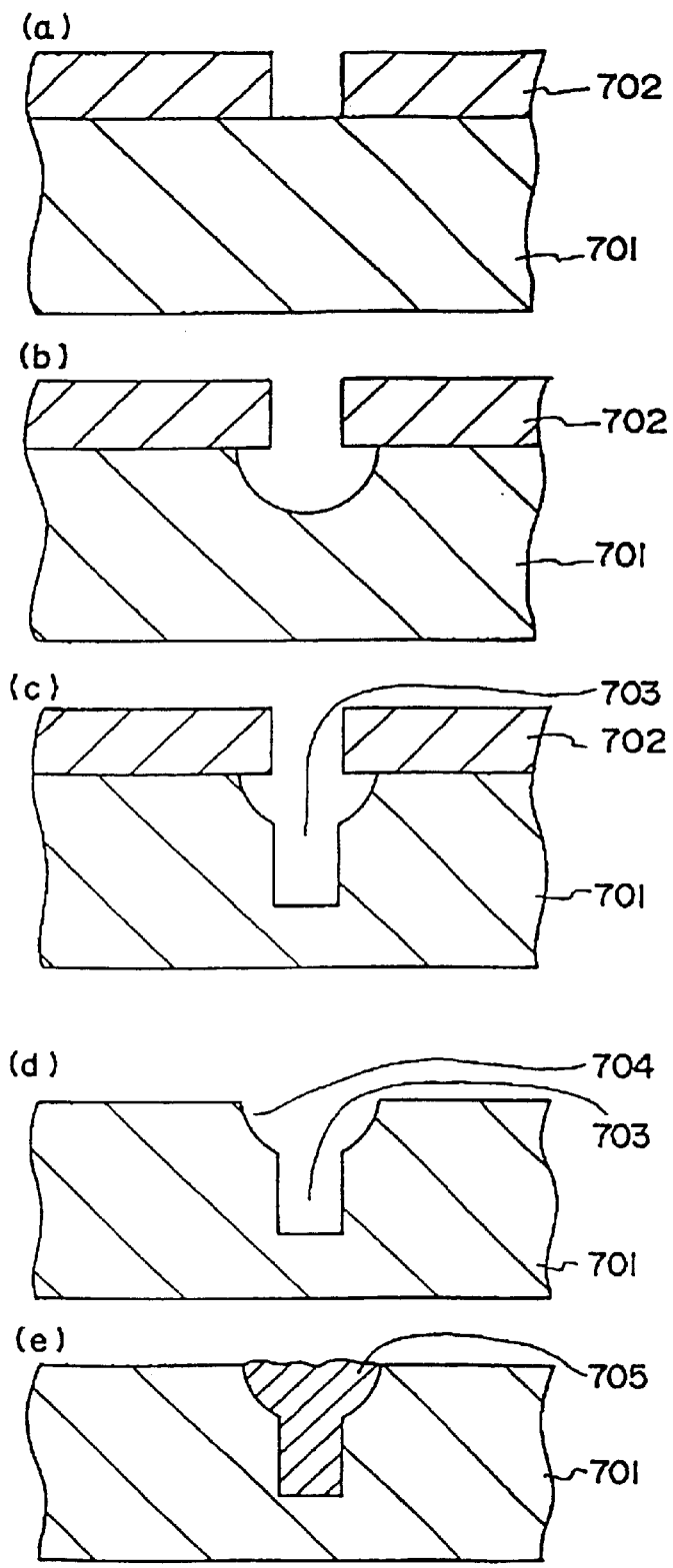
FIG. 7(*a–e*) is drawings showing a conventional dry-etching method.

FIG. 6 is schematic sectional views showing a dry-etching method according to the third embodiment of the present invention.

First, as shown in FIG. 6(a), on a silicon substrate 601 are formed a silicon oxide film 602 and a silicon nitride film 603 in this order; a photoresist 604 is applied and lithography is conducted to form a pattern; and the silicon nitride film 603 and the silicon oxide film 602 are subjected to known dry etching.

Then, as shown in FIG. 6(b), the resulting semiconductor substrate is subjected to etching by the use of a dry-etching apparatus shown in FIG. 2, whereby the silicon substrate 601 is subjected to etching while a reaction product 606 is being deposited on the side wall of a groove formed by etching.

In the present embodiment, when etching is conducted under the conditions of $Cl_2$=20–30 sccm, HBr=15–20 sccm, CO=50–100 sccm, etching pressure=0.02–0.05 Torr, RF power density=1.01–1.64 $W/cm^2$ and stage temperature= 10–20° C., grooves of good tapered sectional shape can be obtained. In this case, the substrate temperature is preferably 40–50° C.

Lastly, as shown in FIG. 6(c), the reaction product 606 deposited on the side wall of groove and the photoresist 604 are removed using $H_2SO_4/H_2O_2$; an insulating film (e.g. silicon oxide film) 605 is filled up in the groove; the insulating film 605 is polished by a CMP technique; the silicon nitride film 603 and the silicon oxide film 602 are removed by wet etching; thereby, isolation is completed.

In the present embodiment, the main component of the reaction product 606 deposited on the side wall of groove is carbon; therefore, the treatment after etching is simple.

What is claimed is:

1. A method for dry-etching a silicon substrate by a use of a mask selectively formed on the silicon substrate, in which method a reaction product of dry etching is deposited, during dry etching, in a uniform thickness on the side wall of each groove formed in the silicon substrate by dry etching; wherein a dry-etching gas containing an oxygen element is used, and further, wherein the dry-etching gas is a mixed gas containing $Cl_2$, HBr, $O_2$ and He.

2. A method according to claim 1, wherein the dry-etching of the silicon substrate is conducted under the conditions of a dry-etching gas pressure of 0.02–0.05 Torr, a RF power density of 1.01–1.64 $W/cm^2$ and a silicon substrate temperature of 40–50° C.

3. A method for dry-etching a silicon substrate by the use of a mask selectively formed on the silicon substrate, in which method a reaction product of dry etching is deposited during dry etching, in a uniform thickness on the side wall of each groove formed in the silicon substrate by dry etching; wherein a dry-etching gas containing an oxygen element is used, and further, wherein the dry-etching gas is a mixed gas containing $Cl_2$, HBr and CO.

4. A method according to claim 3, wherein the dry-etching of the silicon substrate is conducted under the conditions of a dry-etching gas pressure of 0.02–0.05 Torr, a RF power density of 1.01–1.64 $W/cm^2$ and a silicon-substrate temperature of 40–50° C.

5. A method according to either claim 1 or 3, wherein each groove formed in the silicon substrate by dry etching has a tapered sectional shape.

6. A method according to either claim 1 or 3, wherein a photoresist is used as a mask material.

7. A method according to claim 3, wherein the main component of the reaction product is carbon.

* * * * *